(12) United States Patent
Meinecke et al.

(10) Patent No.: US 8,964,387 B2
(45) Date of Patent: Feb. 24, 2015

(54) POWER CONVERTER ARRANGEMENT AND METHOD FOR OPERATING A POWER CONVERTER ARRANGEMENT

(75) Inventors: Carsten Meinecke, Karlsruhe (DE); Frank Furch, Osthofen (DE)

(73) Assignee: Alstom Technology Ltd., Baden (CH)

( * ) Notice: Subject to any disclaimer, the term of this patent is extended or adjusted under 35 U.S.C. 154(b) by 174 days.

(21) Appl. No.: 13/446,872

(22) Filed: Apr. 13, 2012

(65) Prior Publication Data

US 2012/0262884 A1    Oct. 18, 2012

(30) Foreign Application Priority Data

Apr. 14, 2011 (EP) .................. 11162385

(51) Int. Cl.
H05K 7/20 (2006.01)
H02M 7/162 (2006.01)
H02H 7/06 (2006.01)
H02M 7/00 (2006.01)
H02M 7/06 (2006.01)
H02M 7/219 (2006.01)
H02M 7/757 (2006.01)
H02M 7/797 (2006.01)

(52) U.S. Cl.
CPC ........... *H02M 7/162* (2013.01); *H05K 7/20909* (2013.01); *H02H 7/065* (2013.01); *H02M 7/003* (2013.01); *H02M 7/06* (2013.01); *H02M 7/219* (2013.01); *H02M 7/757* (2013.01); *H02M 7/797* (2013.01)
USPC ........... 361/697; 361/677; 361/678; 361/695; 361/704; 361/722; 165/185; 363/141; 174/16.2

(58) Field of Classification Search
USPC ......... 361/676–678, 690, 694–695, 697, 704, 361/707, 709, 722; 165/185; 174/16.2; 363/141
See application file for complete search history.

(56) References Cited

U.S. PATENT DOCUMENTS

| | | | | |
|---|---|---|---|---|
| 3,098,963 | A * | 7/1963 | Michaelis | 363/141 |
| 3,253,646 | A * | 5/1966 | Koltuniak et al. | 165/299 |
| 4,138,706 | A * | 2/1979 | Johnson et al. | 361/42 |
| 5,453,901 | A | 9/1995 | Lackey | |
| 6,075,717 | A * | 6/2000 | Kumar et al. | 363/87 |
| 6,304,443 | B1 * | 10/2001 | Chou | 361/695 |
| 6,603,661 | B2 * | 8/2003 | Smith et al. | 361/695 |
| 6,700,778 | B1 * | 3/2004 | Wang | 361/690 |
| 6,721,181 | B1 * | 4/2004 | Pfeifer et al. | 361/704 |
| 6,822,850 | B2 * | 11/2004 | Pfeifer et al. | 361/611 |
| 6,870,737 | B2 * | 3/2005 | Hashimoto et al. | 361/709 |
| 6,885,553 | B2 * | 4/2005 | Pfeifer et al. | 361/688 |
| 6,998,735 | B2 * | 2/2006 | Gibbs | 307/151 |
| 7,068,507 | B2 * | 6/2006 | Pfeifer et al. | 361/699 |

(Continued)

FOREIGN PATENT DOCUMENTS

| | | | | |
|---|---|---|---|---|
| DE | 4022033 | | 1/1991 | |
| DE | 4022033 | A1 * | 1/1991 | H02M 1/00 |

(Continued)

*Primary Examiner* — Robert J Hoffberg
(74) *Attorney, Agent, or Firm* — Buchanan Ingersoll & Rooney PC

(57) ABSTRACT

A power converter arrangement has two static switching element bridges that are alternatively operable and comprise static switching elements. The power converter arrangement has one housing that houses the two static switching element bridges; the housing has one cooling system for the static switching element bridges housed therein.

11 Claims, 3 Drawing Sheets

(56) References Cited

U.S. PATENT DOCUMENTS 7,515,422 B2 * 4/2009 Hirota et al. .................. 361/709
2013/0308362 A1 * 11/2013 Karlsson et al. ............. 363/141

FOREIGN PATENT DOCUMENTS

DE             4237283 C1 *  3/1994  ............... H02H 7/12
WO          2009027520       3/2009

* cited by examiner

POWER CONVERTER ARRANGEMENT AND METHOD FOR OPERATING A POWER CONVERTER ARRANGEMENT

RELATED APPLICATION

The present application hereby claims priority under 35 U.S.C. Section 119 to European Patent Application Number 11162385.6, filed Apr. 14, 2011, the entire contents of which are hereby incorporated by reference.

FIELD OF INVENTION

The present invention relates to a power converter arrangement and a method for operating it. In particular the power converter arrangement can be a component of a static exciter of a large synchronous generator that is connected between a three-phase voltage supply and dc field windings of the synchronous generator.

BACKGROUND

FIG. 1 schematically shows a typical power converter arrangement for a high-power application. The power converter arrangement has a frame 2 that houses two identical power converter devices 3 (for redundancy reasons).

Each power converter device 3 has a housing 4 that houses a static switching element bridge 5 each having a multi-phase ac input 6 (such as a three phase input) connected to a multi-phase ac voltage supply 7, and a dc output connected via dc connections 8 to a load, e.g. the field windings of the synchronous generator.

Each housing 4 is provided with a cooling system 9 that typically includes one or more fans that urge cooling air through the housing 4 for it to cool the static switching element bridge 5 contained therein.

Each static switching element bridge 5 is composed of 2×n switching elements 10, exemplarily represented by thyristor symbols, where n denotes the number of phases of the multi-phase ac input 6. The switching elements 10 may be power semiconductor switches such as diodes, thyristors, gate-turn-off thyristors (GTOs), bipolar junction transistors, or insulated gate bipolar transistors (IGTBs).

The redundancy of the power converter bridges 5 is such, that each static switching element bridge 5 alone is able to carry the rated current of the system.

In normal operation, one of the two static switching element bridges 5 is active and carries 100% of the system current and the other is in standby (i.e. it does not operate).

In case a fault is detected in the active static switching element bridge 5, it is blocked and the standby static switching element bridge is activated.

Even if the traditional arrangements proved to be quite effective in operation, nevertheless they require a large space for their installation, in particular because (for redundancy reasons) they include two power converter devices 3. In a power plant space is typically limited and costly, in particular in zones close to the synchronous generator; thus positioning of a bulky component could be troubling and expensive.

In addition, the costs of the arrangements are quite high, in particular because the power converter devices 3 are expensive and the arrangements include two of them.

SUMMARY

The present disclosure is directed to a power converter arrangement including at least two static switching element bridges. The static switching element bridges are alternatively operable and include static switching elements. The power converter arrangement includes one housing that houses the at least two static switching element bridges. The housing also includes one cooling system for the static switching element bridges housed therein.

The present disclosure is also directed to a method for operating a power converter arrangement including static switching elements, a housing that houses the static switching elements, and a cooling system for the switching elements housed in the housing. The method includes operating a part of the static switching elements to define a first static switching element bridge that converts a multi-phase ac input voltage into a dc output voltage or vice versa. The method also includes keeping at least a part of the other static switching elements in stand-by, to define a second static switching element bridge able to convert the multi-phase ac input voltage into a dc output voltage or vice versa and alternatively operable with respect to the first static switching element bridge.

BRIEF DESCRIPTION OF THE DRAWINGS

Further characteristics and advantages of the invention will be more apparent from the description of a preferred but non-exclusive embodiment of the power converter arrangement and method illustrated by way of non-limiting example in the accompanying drawings, in which.

DETAILED DESCRIPTION OF THE PREFERRED EMBODIMENTS INTRODUCTION TO THE EMBODIMENTS

An aspect of the present invention includes providing a power converter arrangement that requires a limited space when compared to traditional power converter arrangements.

Another aspect of the invention is to provide a power converter arrangement and a method whose costs are limited when compared to traditional power converter arrangements.

The technical aim, together with these and further aspects, are attained according to the invention by providing a power converter arrangement and a method in accordance with the accompanying claims.

DETAILED DESCRIPTION

Figure 1:
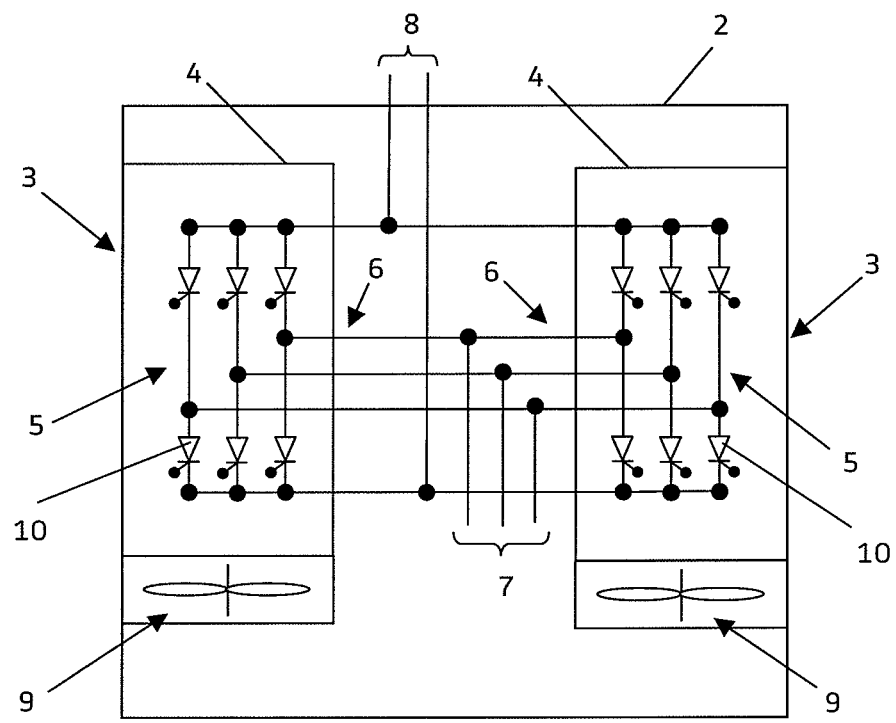
FIG. 1 is a schematic view of power converter arrangements according to the prior art.
Figure 2:
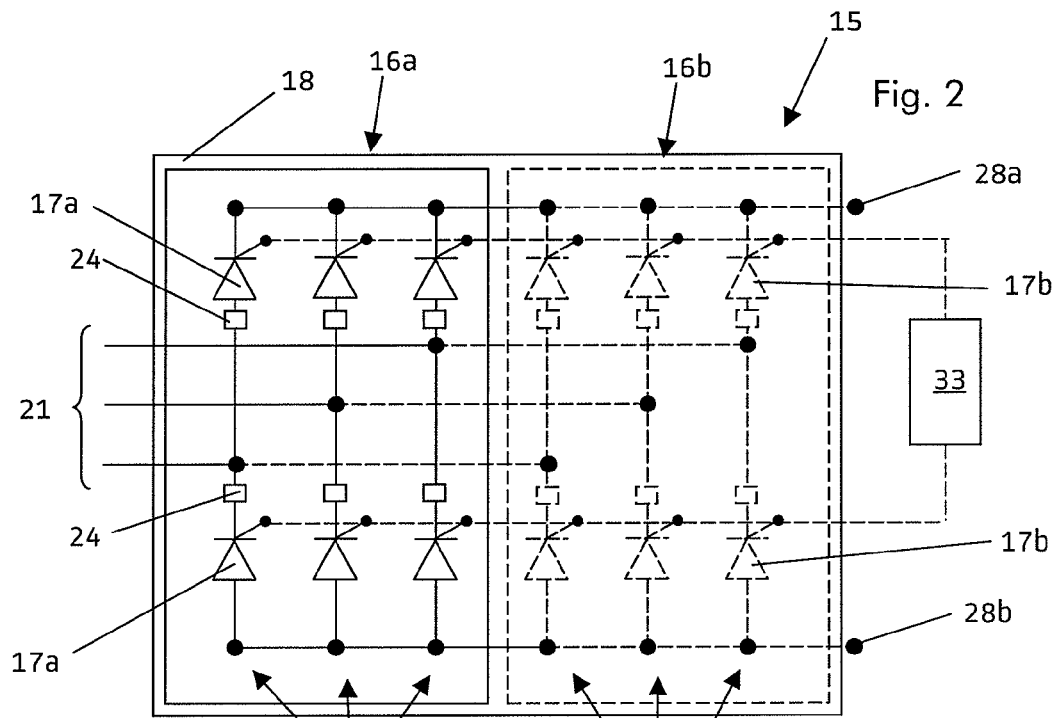
FIGS. 2 and 3 are schematic circuit diagrams of static switching element bridges in two different embodiments of the invention.
Figure 3:
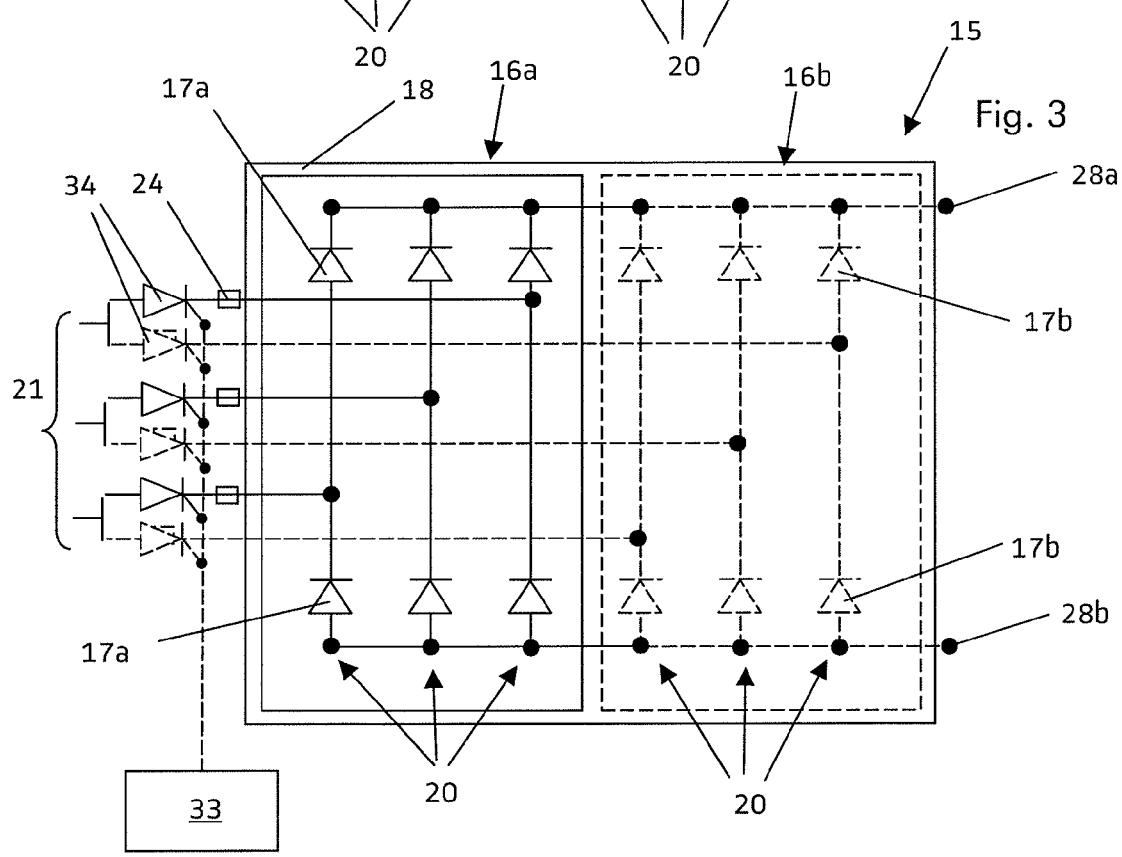

With reference to FIGS. 2 through 5, a power converter arrangement 15 has two static switching element bridges 16a, 16b that are alternatively operable; for example FIGS. 2 and 3 schematically show in solid line an active (i.e. operating) static switching element bridge 16a, and in dashed line a standby (i.e. a non-operating) static switching element bridge 16b. This power converter arrangement 15 is for example a component of an exciter of an electric synchronous generator such as a turbo generator.

Each static switching element bridge 16a, 16b comprises static switching elements 17a, 17b, wherein 17a indicates the static switching elements of the active bridge 16a (i.e. the active static switching elements) and 17b indicates the static switching elements of the standby bridge 17b (i.e. the standby static switching elements).

The static switching elements 17a, 17b may be power semiconductor switches such as diodes, thyristors, gate-turn-off thyristors (GTOs), bipolar junction transistors, or insulated gate bipolar transistors (IGTBs).

Figure 4:
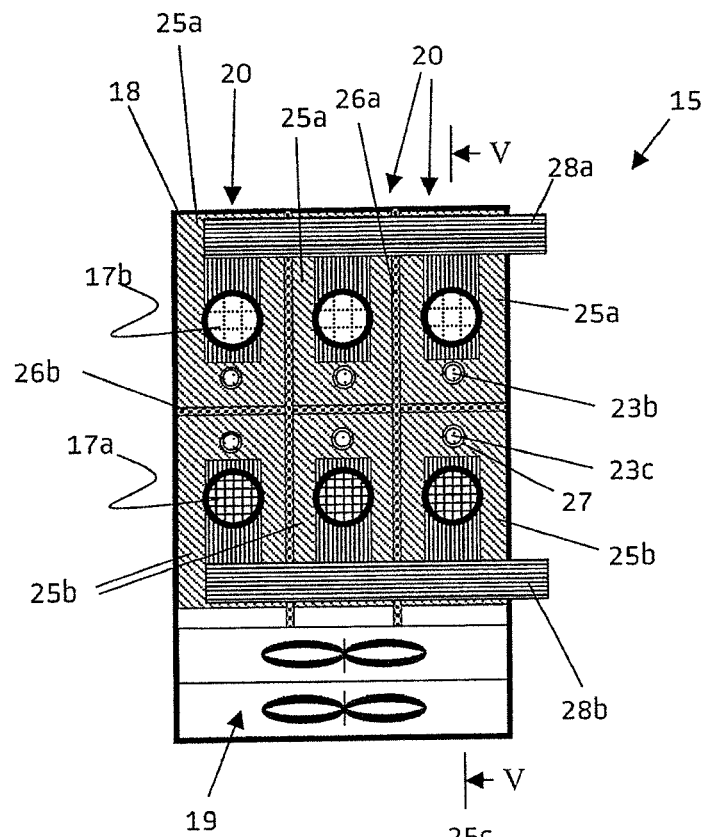
FIGS. 4 and 5 respectively show a schematic cross section through line IV-IV of FIG. 5 and a schematic cross section through line V-V of FIG. 4 of a preferred embodiment of the power converter arrangement.
Figure 5:
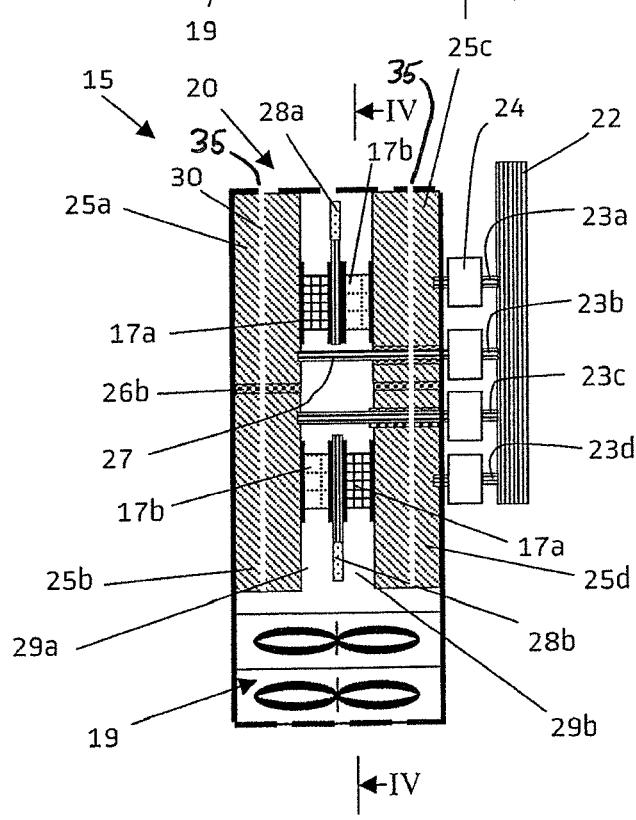

For sake of simplicity, in FIGS. 2 and 3 the switching elements 17a, 17b are exemplary represented by thyristor symbols, whereas in FIGS. 4 and 5 the physical appearance of the switching elements 17a, 17b is represented by a disc-type shape element that is widely used for power electronic components such as diodes or thyristors.

In particular, each static switching element bridge 16a, 16b is composed of 2×n switching elements 17a, 17b, where n denotes the number of phases of the multi-phase ac input voltage 21.

The power converter arrangement 15 has one housing 18 that houses the two static switching element bridges 16a, 16b; in addition the housing 18 has one cooling system 19 (for example a fan unit having one or more fans in series or in parallel) for both the static switching element bridges 16a, 16b housed therein.

For example the cooling system 19 includes a fan unit arranged at the bottom of the housing 18. For redundancy reasons, the cooling system 19 may be furnished with redundant fans (e.g. in FIGS. 4 and 5, a 2×100% redundancy of the fans is depicted).

Since the housing 18 houses two bridges 16a, 16b and is provided with one cooling system 19 for the two static switching element bridges 16a and 16b, the costs and space required for installation are substantially reduced when compared with traditional power converter arrangements.

Each static switching element bridge 16a, 16b has a plurality of branches 20, each branch 20 being connected to one phase of the multi-phase ac input voltage 21. In all figures, a number of three is assumed for the number of phases of the multi-phase ac input voltage 21.

With reference to FIGS. 4 and 5, each branch 20 comprises an ac bus bar 22 for receiving a phase of a multi-phase ac input voltage 21; this bus bar 22 is connected, via conductive rods 23a-23d provided with fuses 24 to heat sinks 25a-25d. Naturally, different configurations are also possible and the rods 23a-23d could be omitted, for example the ac bus bar 22 could have the required shape to achieve the connection.

The heat sinks 25a-25d carry the static switching elements 17. In particular, two facing heat sinks 25a, 25c carry two static switching elements 17a, 17b therebetween; in turn the two static switching elements 17a, 17b have a dc bus bar 28a therebetween. Likewise, the two facing heat sinks 25b, 25d carry two static switching elements 17b, 17a therebetween; in turn these two static switching elements 17b, 17a have a dc bus bar 28b therebetween. The static switching elements 17a, 17b are connected at opposite faces of the dc bus bar 28a, 28b.

Advantageously, the branches 20 of different static switching element bridges 16a, 16b connected to the same phase of the multi-phase ac input voltage 21 have common ac bus bars 22 and common dc bus bar 28a, 28b. In other words, a branch of the bridge 16a connected to a phase of the ac input voltage 21, and a branch of the bridge 16b connected to the same phase (as the above phase) of the ac input voltage 21, have a common (i.e. the same) ac bus bar 22.

Similarly, branches of the bridge 16a connected to a polarity of the dc output voltage, and branches of the bridge 16b connected to the same polarity (as the above polarity) of the dc output voltage, have a common (i.e. the same) dc bus bar 28a or 28b.

The heat sinks 25a-25d (FIG. 5) that are electronically connected to different phases of the multi-phase ac input voltage 21 are electrically insulated from each other by insulating sheets 26a and in addition, in order to provide the protection of each static switching element 17a, 17b by its individual fuse 24, also heat sinks 25a-25d that are connected to the same phase of the multi-phase ac input voltage 21 are electrically insulated from each other by insulating sheets 26b.

In addition, the conductive rods 23b and 23c connected to the heat sinks 25a and 25b lying at a side of the housing 18 opposite the side with the ac bus bars 22, are provided with insulating tubes 27 insulating them from the heat sinks 25c and 25d (because they pass through them); naturally also the conductive rods 23a and 23d can be provided with the insulating tubes 27.

The heat sinks 25a, 25b and 25c, 25d are arranged one on top of the other and the heat sinks 25a, 25c and 25b, 25d are arranged one facing the other.

Preferably, the heat sinks 25a-25d have aligned, preferable vertical, cooling channels 30 that allow for an upwards air flow through them; the housing 18 is permeable above the heat sinks 25a, 25c via holes 35 to blow out heated air and below the cooling system 19 to ingest cooling air.

In particular, the heat sinks 25a, 25d and 25b, 25c, define, together with the dc bus bars 28a, 28b, two cooling channels 29a, 29b.

The static switching elements 17a, 17b of each static switching element bridge 16a, 16b are arranged such that one half of the static switching elements 17a and one half of the static switching elements 17b are located in one common cooling channel, e.g. 29a. The other half of the static switching elements 17a and the other half of the static switching elements 17b are located in the other cooling channel, e.g. 29b. With this configuration, independently of which of the static switching element bridges 16a, 16b is active, always the same number of active static switching elements, namely a number of n, where n denotes the number of phases of the ac input voltage, are located in each cooling channel 29a, 29b. Thus, in the attached drawings, for each branch 20 a part of the static switching elements 17a of the bridge 16a is arranged in the channel 29a and the other part in the other channel 29b; the same is for the other bridge 16b.

This advantageous arrangement has the benefit that the flow of cooling air on both sides of the bus bars 28a, 28b contributes equally to the removal of the total heat losses, resulting in a more homogeneous temperature distribution within the arrangement 15 and a better utilization of the cooling system 19.

Thanks to the advantageous arrangement of the static switching elements 17a, 17b, heat losses of the active static switching elements 17a are not only removed via the directly adjacent heat sink 25a, but also via the heat sink 25c connected to the inactive static switching elements 17b, since the thermal resistance across the dc bus bar 28a and the inactive static switching element 17b is quite low (naturally the same considerations apply for the static switching elements 17b and 17a connected between the heat sinks 25b and 25d and having the dc bus bar 28b therebetween).

Hence, all of the heat sinks 25a-25d contribute to the cooling of the active static switching elements 17a, reducing the required overall mass and volume for the heat sinks considerably.

In the embodiments shown, six static switching elements 17a, 17b in the upper half of the arrangement 15 are connected to the dc bus bar 28a, which is the dc output contact for one polarity, e.g. for the positive polarity, and six static switching elements 17a, 17b in the lower half of the arrangement 15 are connected to the dc bus bar 28b, which is the dc output contact for the other polarity, e.g. for the negative polarity.

For clarity in FIGS. 4 and 5 the static switching elements of the active static switching element bridge 16a have a pattern with a narrow grid and are identified by the reference 17a, and the static switching elements of the non active (stand by) static switching element bridge 16b have a pattern with a large grid and are identified by the reference 17b.

For applications in three-phase ac systems (like the one shown), the arrangement 15 has three branches 20 for a three-phase input voltage, and two output dc bus bars 28a, 28b for a dc output voltage.

In a preferred embodiment, the static switching elements 17a, 17b are controllable switches that are connected to a drive circuit that is driven by a control unit 33.

The control unit 33 activates or deactivates the static switching elements 17a, 17b constituting each of the static switching element bridges 16a, 16b together to define the power converter bridges 16a, 16b from the total number of static switching elements.

For example, the static switching elements 17a, 17b can be thyristors (this example is shown in FIG. 2) or IGBTs; in this case since the thyristors are able to be selectively activated via their firing circuit and the IGBTs via gate driver circuits, the inputs of the two static switching element bridges 16a and 16b are connected in parallel to the multi-phase ac input voltage 21.

As shown, each static switching element 17a, 17b is connected in series to a fuse 24. The response of each fuse 24 is commonly supervised by a blown-fuse indicator.

In case a static switching element 17a, 17b fails, the fuse 24 automatically disconnects the failed element 17 in order to prevent further damage by high fault currents; such a failure is then indicated by a blown-fuse supervision contact.

Upon detection of a blown fuse in the active static switching element bridge, the control unit 33 blocks the active static switching element bridge 16a and activates the standby static switching element bridge 16b.

A different embodiment of the arrangement 15 is shown in FIG. 3, in which the static switching elements 17a, 17b are diodes (i.e. static switching elements whose turn on can not be controlled via a control signal).

Also in this case the multi-phase ac input voltage 21 of the static switching element bridges 16a, 16b are all connected in parallel, but switches 34 (such as thyristors controlled by a control unit 33) are provided to select the inputs of the static switching element bridges 16a or 16b to be actually connected to the multi-phase ac input voltage 21.

The operation of the power converter arrangement 15 is apparent from that described and illustrated and is substantially the following, where reference is made to the embodiment of FIGS. 2 and 4, 5 and static switching elements being thyristors.

The control circuit 33 drives the firing circuits of the thyristors 17 such that one static switching element bridge 16a is activated and the other static switching element bridges 16b is not activated.

The multi-phase ac input voltage 21 supplies multi-phase ac electric power to the switching element bridge 16a that in turn supplies dc electric power via the dc bus bars 28a, 28b to a load (for example field winding of a synchronous generator).

Advantageously, since only one of the thyristors that are located at opposite sides of each dc bus bar 28a, 28b operates (for example the thyristors 17a, FIG. 5), but the other (i.e. the thyristors 17b) is in stand by and does not operate, each operating thyristors 17a can transmit heat (for cooling) to the heat sinks on both sides, to achieve a very efficient cooling.

In addition, since each cooling channel 29a, 29b houses only half of the active thyristors (i.e. the thyristors 17a in the example above), cooling of each thyristors is achieved with cooling air that has the lowest temperature possible; this further improves cooling.

The invention also refers to a method for operating a power converter arrangement 15.

The method includes operating a part of the static switching elements 17a (such as the thyristors), to define a first static switching element bridge 16a that converts a multi-phase ac input voltage into a dc output voltage or vice versa. The method also includes keeping the other static switching elements 17b (such as further thyristor) in stand-by, to define a second static switching element bridge 16b able to convert the multi-phase ac input voltage into a dc output voltage or vice versa and alternatively operable with respect to the first static switching element bridge 16a.

Naturally the features described may be independently provided from one another. In practice the components and materials used and the dimensions can be chosen at will according to requirements and to the state of the art.

REFERENCE NUMBERS

2 frame
3 power converter device
4 housing
5 static switching element bridge
6 multi-phase ac input
7 multi-phase ac voltage supply
8 dc connections
9 cooling system
10 switching elements
15 power converter arrangement
16a active static switching element bridge
16b standby static switching element bridge
17a active static switching element
17b standby static switching element
18 housing
19 cooling system
20 branch of 16a, 16b
21 multi-phase ac input voltage
22 ac bus bar
23a-d conductive rod
24 fuses
25a-d heat sink
26a,b insulating sheet
27 insulating tube
28a,b dc bus bar
29a, 29b cooling channels
30 cooling channels of 25a-d
33 control unit
34 switches

What is claimed is:
1. A power converter arrangement comprising:
at least two static switching element bridges, the static switching element bridges being alternatively operable;
a housing that encloses the at least two static switching element bridges, each of the two static switching bridges including a plurality of static switching elements;
a plurality of heat sinks, wherein each heat sink is connected to a respective one of the plurality of switching elements; and a cooling system within the housing and shared by the at least two static switching element bridges, the cooling system generating an air flow within the housing for cooling the at least two static switching element bridges, wherein each static switching element bridge has a plurality of branches, each branch including respective static switching elements of the plurality of static switching elements, and each branch is connected to a respective phase of a multi-phase ac input voltage, and wherein corresponding branches of each of the static switching element bridges connected to the respective phase of the multi-phase ac input voltage have a corresponding ac bus bar, and the branches of each static switching element bridge are connected to common dc bus bars.

2. The power converter arrangement as claimed in claim 1, further comprising a plurality of conductive rods, each heat sink is connected to the corresponding ac bus bar via one of the plurality of conductive rods.

3. The power converter arrangement as claimed in claim 2, wherein at least some of the conductive rods are provided with insulating tubes.

4. The power converter arrangement as claimed in claim 1, wherein the heat sinks associated with a respective static switching element bridge together with the common dc bus bar defines two first cooling channels, and wherein each of the static switching elements of each respective static switching element bridge being housed in a respective one of the two first cooling channels.

5. The power converter arrangement as claimed in claim 1, wherein each heat sink includes a second cooling channel, and the housing comprises holes aligned with each second cooling channel.

6. The power converter arrangement as claimed in claim 1, wherein an insulating sheet is provided between adjacent heat sinks of the plurality of heat sinks that are electrically connected to different phases of the multi-phase ac input voltage.

7. The power converter arrangement as claimed in claim 1, wherein an insulating sheet is provided between adjacent heat sinks of the plurality of heat sinks that are electrically connected to the respective phase of the multi-phase ac input voltage.

8. The power converter arrangement as claimed in claim 1, wherein the static switching elements are controllable switches.

9. The power converter arrangement as claimed in claim 8, wherein each controllable switch of the controllable switches is connected in series to a fuse.

10. The power converter arrangement as claimed in claim 8, wherein each controllable switch of the controllable switches is connected to a drive circuit that is driven by a control unit, wherein the control unit activates or deactivates the controllable switch constituting each of the static switching element bridges together.

11. A method for operating a power converter arrangement comprising a plurality of static switching elements, a housing that encloses the static switching elements, and a cooling system within the housing, the method comprising:

operating a first set of static switching elements in the plurality of static switching elements, to define a first static switching element bridge that converts a multi-phase ac input voltage into a dc output voltage or vice versa;

keeping at least a second set of static switching elements in the plurality of static switching elements in stand-by, wherein the second set of static switching elements establish a second static switching element bridge configured to convert the multi-phase ac input voltage into the dc output voltage or vice versa and alternatively operable with respect to the first static switching element bridge;

generating, via the cooling system, an air flow within the housing for cooling the plurality of static switching elements, and providing a plurality of heat sinks, wherein each heat sink is connected to a respective one of the plurality of switching elements, wherein each of the first and second static switching element bridge has a plurality of branches, each branch being connected to a respective phase of a multi-phase ac voltage, and each branch including respective static switching elements of the plurality of static switching elements, and wherein corresponding branches of each of the first and second static switching element bridges connected to the respective phase of the multi-phase ac voltage have a corresponding ac bus bar, and the branches of each static switching element bridge are connected to common dc bus bars.

* * * * *